(12) United States Patent
Bollenbeck

(10) Patent No.: US 11,143,724 B2
(45) Date of Patent: Oct. 12, 2021

(54) RECEIVING DEVICE FOR FREQUENCY-MULTIPLEXED SIGNALS

(71) Applicant: Siemens Healthcare GmbH, Erlangen (DE)

(72) Inventor: Jan Bollenbeck, Eggolsheim (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/516,179

(22) Filed: Jul. 18, 2019

(65) Prior Publication Data
US 2020/0025848 A1 Jan. 23, 2020

(30) Foreign Application Priority Data
Jul. 19, 2018 (DE) .................. 10 2018 212 087.0

(51) Int. Cl.
*G01R 33/36* (2006.01)
*G01R 33/3415* (2006.01)

(52) U.S. Cl.
CPC ..... *G01R 33/3621* (2013.01); *G01R 33/3415* (2013.01)

(58) Field of Classification Search
CPC ................... G01R 33/3621; G01R 33/3415
See application file for complete search history.

(56) References Cited

U.S. PATENT DOCUMENTS

| 4,992,736 | A | * | 2/1991 | Stormont | ........... | G01R 33/3621 |
| | | | | | | 324/309 |
| 8,055,196 | B2 | | 11/2011 | Biber | | |
| 9,592,032 | B2 | * | 3/2017 | Rothberg | ............. | A61B 8/4494 |
| 2005/0258821 | A1 | | 11/2005 | Wang et al. | | |
| 2008/0036643 | A1 | | 2/2008 | Kiukkonen | | |
| 2009/0121717 | A1 | | 5/2009 | Haans et al. | | |
| 2009/0230966 | A1 | | 9/2009 | Ehnholm | | |
| 2009/0286478 | A1 | | 11/2009 | Biber | | |
| 2011/0109315 | A1 | | 5/2011 | Biber | | |
| 2013/0093412 | A1 | | 4/2013 | Anelli et al. | | |
| 2014/0361775 | A1 | | 12/2014 | Bensheng et al. | | |

(Continued)

FOREIGN PATENT DOCUMENTS

| CN | 101031812 A | 9/2007 |
| CN | 101283287 A | 10/2008 |

(Continued)

OTHER PUBLICATIONS

German Office Action for German Application No. 10 2018 212 087.0 dated Jun. 11, 2019.

(Continued)

*Primary Examiner* — Dixomara Vargas
(74) *Attorney, Agent, or Firm* — Lempia Summerfield Katz LLC

(57) ABSTRACT

A receiving device for two signals having different center frequencies. The receiving device includes a sampler. A first signal of the two signals and a second signal of the two signals are supplied to a first signal-input of the sampler in a time multiplex. The sampler digitizes the first signal and the second signal at a sampling rate. The receiving device also includes a frequency mirroring device that mirrors the second digital signal in a frequency domain about a quarter of the sampling rate.

13 Claims, 4 Drawing Sheets

(56) References Cited

U.S. PATENT DOCUMENTS

| | | | |
|---|---|---|---|
| 2015/0177344 A1 | 6/2015 | Han et al. | |
| 2015/0285887 A1 | 10/2015 | Bollenbeck | |
| 2015/0297193 A1* | 10/2015 | Rothberg | A61B 8/56 600/459 |
| 2016/0380488 A1 | 12/2016 | Widmer et al. | |
| 2017/0135676 A1* | 5/2017 | Rothberg | A61B 8/56 |

FOREIGN PATENT DOCUMENTS

| | | |
|---|---|---|
| CN | 101557284 A | 10/2009 |
| CN | 102053233 A | 5/2011 |
| CN | 102103195 A | 6/2011 |
| CN | 102148790 A | 8/2011 |
| CN | 102565733 A | 7/2012 |
| CN | 103140770 A | 6/2013 |
| CN | 103453983 A | 12/2013 |
| CN | 104471421 A | 3/2015 |
| CN | 104730478 A | 6/2015 |
| CN | 107787542 A | 3/2018 |
| DE | 102008023467 A1 | 12/2009 |
| DE | 102014206311 B3 | 10/2015 |
| DE | 102015218331 A1 | 1/2017 |
| WO | 2006075214 A2 | 7/2006 |

OTHER PUBLICATIONS

Lyons, Richard G. "Digital Signal Processing: Frequency Translation Without Multiplication", DSP, EE Times-India, Sep. 2007, eetindia.com, pp. 1-4.

Qin, Xu et al:"Frequency division multiplexing multichannel receiving method of magnetic resonance signal"; Abstracts of the papers of the 14th National Academic Conference on Spectroscopy; pp. 272-273; 1-4 with English translation. 2016.

Chinese Office Action for Chinese Application No. 201910649225.2 dated May 8, 2021, with English translation.

* cited by examiner

RECEIVING DEVICE FOR FREQUENCY-MULTIPLEXED SIGNALS

This application claims the benefit of DE 10 2018 212 087.0, filed on Jul. 19, 2018, which is hereby incorporated by reference in its entirety.

BACKGROUND

The present embodiments relate to a receiving device for frequency-multiplexed signals.

Magnetic resonance tomographs are imaging devices that, in order to image a subject under examination, align nuclear spins of the subject under examination with a strong external magnetic field, and use an alternating magnetic field to excite the nuclear spins to precess about this alignment. In response, the precession or return of the spins from this excited state into a low-energy state in turn produces an alternating magnetic field (e.g., the magnetic resonance signal), which is received by antennas.

Gradient magnetic fields are used to apply spatial encoding to the signals, so that the received signal may subsequently be associated with a volume element. The received signal is then analyzed, and a three-dimensional imaging representation of the subject under examination is provided. The generated representation indicates a spatial density distribution of the spins.

In order to improve the signal-to-noise ratio, and also to accelerate the image acquisition using parallel scanning, it is increasingly the case to arrange the maximum possible number of receive antennas, in the form of an antenna array known as a local-coil array, as close as possible to the body of the patient. The time needed for the image acquisition, however, may only be kept constant or even reduced if the signals are acquired and processed simultaneously.

This requires a multiplicity of receivers, at least large portions of which are nowadays implemented in the form of digital signal processing. Systems that have 8, 16, 32, 64, or even 128 parallel receive channels are available. Substantial cost factors in these systems are the analog-to-digital converters, which are to digitize at a high sampling rate and also at maximum possible resolution. Consequently, there are approaches in which the analog-to-digital converters are used in a time multiplex for a plurality of channels. In these cases, a sample-and-hold element buffers the analog value at the input to the analog-to-digital converter in order to prevent additional bit errors occurring as a result of changes during the conversion. The functional unit including sample-and-hold element and analog-to-digital converter is referred to below as a "sampler".

The sample-and-hold element uses as the analog storage device a capacitance, which is charged via a switch by the signal applied to the input of the sampler. The finite conductivity of the switch is among the causes of the charge from the capacitance not being transferred in full within a multiplex time window, on each occasion resulting in crosstalk from the previous channel onto the subsequent receive channel. This effect increases as scanning cycles become ever shorter with an increasing number of channels, because of the ever shorter switchover cycles.

DE 10 2008 023 467 discloses an arrangement for transmitting magnetic resonance signals, in which arrangement, for the purpose of transmission by a frequency multiplex, mixing frequencies are used to convert the magnetic resonance signals such that the intermediate frequencies are mirror-symmetrical with respect to the sampling frequency or a multiple thereof.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a multichannel, low-cost receiving device for a magnetic resonance tomograph is improved.

The receiving device according to one or more of the present embodiments is configured to receive a first signal having a first center frequency, and a second signal having a second center frequency. The first center frequency differs from the second center frequency. The first signal and the second signal may be substantially disjunct in the frequency domain (e.g., in a frequency range between a first center frequency and a mean value of first center frequency and second center frequency, the level of the second signal is attenuated with respect to a maximum level of the first signal by more than 40 dB, 60 dB or 80 dB). The same applies reciprocally to the first signal in a range about the second center frequency. Signals of this type may be generated, for example, in a magnetic resonance tomograph if the receive signals from individual antenna coils of a local-coil array are down-converted into different frequency ranges by different local oscillator signals in order to be transmitted jointly over a cable in a frequency multiplex.

The receiving device includes a sampler having a first signal-input. The first signal and the second signal are supplied to a first signal-input of the sampler in a time multiplex. The first signal and the second signal are each sampled by the sampler at a sampling rate that is obtained from the Nyquist theorem and is higher than twice the total bandwidth of both signals, so that the full information content of both signals is acquired in the sampling. In the case that the first analog signal and the second analog signal have an equal bandwidth, the sampling rate AR is thus higher than four times the bandwidth of one of the analog signals. For a signal transmitted by a carrier frequency in the frequency multiplex, it may also be the case here that a center frequency is greater than the sampling rate, and therefore, bandpass subsampling is performed at a sampling rate less than the carrier frequency, with the resultant digitized signal folded down about the sampling frequency in the frequency range. The sampling rate and the center frequencies may be selected such that after the sampling, the first digital signal and the second digital signal in the frequency domain lie at baseband symmetrically about a frequency equal to a quarter of the sampling rate (e.g., AR/4).

The sample-and-hold element and the analog-to-digital converter work here at a sample rate equal to the sampling rate multiplied by the number of channels of the multiplexer (e.g., at least twice the sampling rate for one channel), and a multiple thereof for a plurality of channels. In one exemplary embodiment, a channel includes just the first analog signal and the second analog signal, and therefore in this case, the sampling rate is greater than four times the bandwidth of a signal.

The sampler is consequently configured to digitize the time-multiplexed first and second signals into a first digital signal and a second digital signal at a sampling rate AR for output at the second signal-output.

The receiving device also includes a frequency mirroring device, which mirrors the second digital signal in the frequency domain about a quarter of the sampling rate (AR/4). The frequency mirroring device advantageously performs mirroring on the frequency axis about the value AR/4, with the result that the second wanted signal lies in the same orientation and at the same baseband center frequency as the first signal, and signal components generated by crosstalk are again separated from the wanted signal in the frequency domain.

In a possible embodiment of the receiving device, this device also includes a mixer as the frequency mirroring device, which mixes the second digital signal with a frequency equal to half the sampling rate AR (AR/2).

In another embodiment, a decimator that produces mirroring about half the sampling rate AR/2, for example, is also deemed to be a frequency mirroring device within the meaning of the present embodiments. This may be achieved, for example, by decimator FIR filters in signal paths for the first digital signal and the second digital signal having identical coefficients, which differ merely by an alternating factor $(-1)^n$ in front of the filter coefficients $F_n$.

The frequency mirroring device may advantageously be implemented simply and economically in terms of resources using the mixer and the decimator.

In a possible embodiment of the receiving device, the receiving device also includes a filter for filtering crosstalk products of the sampler for the first digital signal and/or the second digital signal. The cutoff frequency of the filter lies at a quarter of the sampling rate AR. This may be that as a result of mirroring the first and/or second digital signal about a frequency that is substantially equal to a quarter of the sampling rate (e.g., AR/4), then wanted signal and crosstalk signal for the first digital signal and the second digital signal come to lie identically in the frequency domain and may be suppressed by an identical filter. The filter is configured such that the frequency response of the filter suppresses crosstalk signals by more than 20 dB, 30 dB, 40 dB or 60 dB with respect to wanted signals (e.g., first digital signal and/or second digital signal). For example, the filter may be a low-pass filter, although high-pass filters may also be provided if frequencies are swapped over, or bandpass filters may be provided generally.

The filter having the cutoff frequency at a quarter of the sampling rate suppresses the unwanted crosstalk signals, which the method according to one or more of the present embodiments separates in the frequency domain.

In an embodiment of the receiving device, the following condition holds for the first center frequency (MF1) and the second center frequency (MF2): $m*AR<MR<(m+1/4)*AR$ and $(n+1/2)*AR<MF2<(n+3/4)*AR$, or $(m+1/4)*AR<MR<(m+1/2)*AR$ and $(n+3/4)*AR<MF2<(n+1)*AR$; where m and n are natural numbers including zero.

In other words, the center frequency of the first signal and, for example, also substantially the first signal itself lie in a frequency range bounded by the sampling rate multiplied by a first multiplier and the sampling rate multiplied by the first multiplier plus a quarter of the sampling rate. The center frequency of the second signal and, for example, also substantially the second signal itself lie in a frequency range bounded by the sampling rate multiplied by a second multiplier plus half the sampling rate and the sampling rate multiplied by the second multiplier plus three-quarters of the sampling rate. The first multiplier and the second multiplier are whole natural numbers including zero.

The statement that substantially the first signal or the second signal itself lies in the frequency range may be that components outside the frequency range are attenuated by more than 20 dB, 30 dB, 40 dB or 60 dB with respect to a maximum inside the interval.

Alternatively, the center frequency of the first signal and, for example, also substantially the first signal itself lie in a frequency range bounded by the sampling rate multiplied by a first multiplier plus a quarter of the sampling rate and the sampling rate multiplied by the first multiplier plus half the sampling rate. The center frequency of the second signal and, for example, also substantially the second signal itself lie in a frequency range bounded by the sampling rate multiplied by a second multiplier plus a quarter of the sampling rate and the sampling rate multiplied by the second multiplier plus one.

In a possible embodiment of the receiving device, the following condition may also hold for the first center frequency (MF1) and the second center frequency (MF2): $m*AR<MR<(m+1/4)*AR$ and $(n+1/4)*AR<MR<(n+1/2)*AR$; or $(m+1/2)*AR<MF2<(m+3/4)*AR$ and $(n+3/4)*AR<MF2<(n+1)*AR$; where m and n are natural numbers including zero. In this case, however, the two signals are taken into baseband into a different spectral position, which may make further mirroring or adapted post-processing necessary.

Signal processing in the receiving device according to one or more of the present embodiments makes it possible to use or to select according to a frequency scheme also a plurality of frequency pairs having corresponding crosstalk attenuation.

In a possible embodiment of the receiving device, the receiving device is configured to digitize, by the sampler, a plurality of pairs of first signals and second signals in a time multiplex for output as a plurality of first digital signals and second digital signals at the second signal-output. The first center frequencies and the second center frequencies of all the pairs are different. Being different may be, for example, that the center frequencies are each obtained for different n and m according to the inequalities above relating to the frequency ranges.

By virtue of a multiplicity of different center frequencies, the crosstalk signals may be suppressed when, for example, more than one signal pair is meant to be transmitted in a cable by frequency multiplexing by modulating these signal pairs onto the multiplicity of center frequencies.

In another conceivable embodiment, the receiving device is configured to digitize, by the sampler, a plurality of pairs of first signals and second signals in a time multiplex for output as a plurality of first digital signals and second digital signals at the second signal-output. The first center frequency is substantially identical and the second center frequency is substantially identical in each of the pairs. If the frequencies fall within the same frequency range according to the inequalities above, this may be deemed as substantially identical.

A multiplicity of signals may be carried in pairs at two different center frequencies as carrier frequency on a plurality of cables. The frequency scheme of the receiving device according to one or more of the present embodiments then advantageously allows a multiplicity of signals to be processed without crosstalk in the signal processing using just one frequency pair and a correspondingly small bandwidth.

In a possible embodiment of the receiving device, the receiving device includes a changeover switch. The changeover switch is configured to invert the sign for every second sample in the second digital signal.

As a result of the change in sign for every second sample in the second signal, the changeover switch acts as a mixer performing mixing at a frequency equal to half the sampling rate. Such a mixer may be implemented advantageously with low complexity in digital signal processing.

In a conceivable embodiment of the receiving device, the receiving device includes a time multiplexer. A first signal-output of the time multiplexer has a signal connection to a first signal-input of the sampler. The time multiplexer is configured to multiplex the first signal and the second signal in time for output at the first signal-output to the sampler. Such a time multiplexer may be implemented, for example, by an analog multiplexer having a plurality of analog MOS switches, which are switched by control electronics at the sample rate to connect cyclically in succession to the first signal-output.

The time multiplexer makes it possible to connect to a shared A/D converter a plurality of cables from local-coil arrays containing MRI signals and hence to install fewer numbers of these costly components in order to reduce costs.

In a possible embodiment of the receiving device, the receiving device also includes a diplexer having a plurality of third signal-outputs. The diplexer is configured to separate an incoming frequency-multiplexed signal into individual channels, and to output the channels separately at the third signal-outputs. In the simplest case involving two signals having different first center frequency and second center frequency, for example, this may be achieved by the third signal-input having a connection via a high-pass filter to a third signal-output, and via a low-pass filter to another third signal-output, with the cutoff frequencies of the high-pass filter and low-pass filter lying between the first center frequency and the second center frequency. The third signal-outputs each have a signal connection to a signal input of the time multiplexer.

The diplexer allows the different signals in the frequency multiplex to be separated in advance, so that in the subsequent analog-to-digital conversion, the signals occur separately and hence at a lower maximum level than the total signal, and thus a better dynamic range and signal-to-noise ratio may be achieved for the individual signals.

The magnetic resonance tomograph according to one or more of the present embodiments includes a receiving device. In addition, the magnetic resonance tomograph includes a local-coil array having a plurality of antenna coils. The local-coil array is configured to transmit over a signal connection a plurality of magnetic resonance signals from the antenna coils in a frequency multiplex. The local-coil array may include, for example, a local oscillator and a mixer in order to convert one or more of the signals from the antenna coils into a different frequency range. The signals in the frequency multiplex may then be transmitted jointly to the receiving device according to one or more of the present embodiments of the magnetic resonance tomograph (e.g., over a coaxial cable or another waveguide, including optically).

The method according to one or more of the present embodiments for operating the magnetic resonance tomograph includes the act of the sampler digitizing time-multiplexed first and second signals into a first digital signal and a second digital signal at a sampling rate (AR). The first signal has a first center frequency (MF1) and the second signal has a second center frequency (MF2). The first center frequency (MF1) differs from the second center frequency (MF2).

The method also includes the acts of a frequency mirroring device mirroring the second digital signal in the frequency domain about a quarter of the sampling rate (AR/4).

The magnetic resonance tomograph according to one or more of the present embodiments and the method according to one or more of the present embodiments share the advantages of the receiving device according to one or more of the present embodiments.

DETAILED DESCRIPTION

Figure 1:
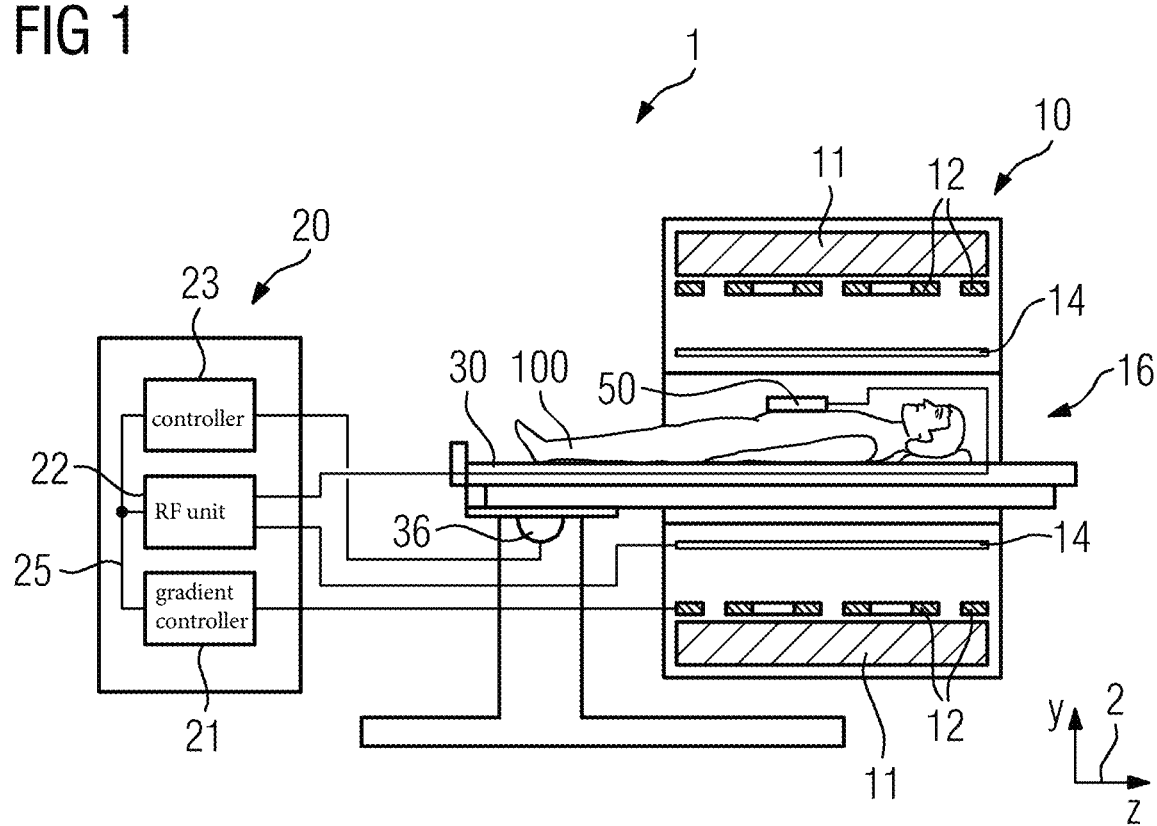
FIG. 1 shows schematically by way of example a magnetic resonance tomograph having a receiving device.

FIG. 1 shows schematically an embodiment of a magnetic resonance tomograph 1 having a receiving device.

The magnet unit 10 includes a field magnet 11 that produces a static magnetic field B0 for aligning nuclear spins of samples or a patient 100 in an acquisition region. The acquisition region is arranged in a patient tunnel 16 that extends through the magnet unit 10 in a longitudinal direction 2. A patient 100 may be moved into the acquisition region by the patient couch 30 and the travel unit 36 of the patient couch 30. The field magnet 11 may be a superconducting magnet that may provide magnetic fields having a magnetic flux density of up to 3 T, or even higher in the latest equipment. For lower field strengths, however, permanent magnets or electromagnets having normal-conducting coils may also be used.

The magnet unit 10 also includes a body coil 14 configured to radiate into the examination volume a radiofrequency signal supplied via a signal line, to receive resonance signals emitted by the patient 100, and to output the resonance signals via a signal line. For receiving the radiofrequency signal, however, the body coil 14 may be replaced by local-coil arrays 50, which are arranged in the patient tunnel 16 close to the patient 100. The local-coil array 50 may, however, be configured for sending and receiving.

A control unit 20 supplies the magnet unit 10 with the signals for the body coil 14, and analyzes the received signals. A magnetic resonance tomograph controller 23 coordinates the sub-units in this process.

Thus, the control unit 20 includes a gradient controller 21 configured to supply the gradient coils 12 via supply lines with variable currents that provide, coordinated in time, the desired gradient fields in the examination volume.

The control unit 20 includes a radiofrequency unit 22 configured to produce a radiofrequency pulse having a defined variation over time, amplitude, and spectral power distribution for the purpose of exciting magnetic resonance of the nuclear spins in the patient 100. Pulse powers may reach in the region of kilowatts. The individual units are interconnected via a signal bus 25.

The radiofrequency signal produced by the radiofrequency unit 22 is fed via a signal connection to the body coil 14, and radiated into the body of the patient 100 in order to excite nuclear spins there. In one embodiment, the radiofrequency signal may be emitted via one or more coil-windings of the local-coil array 50.

The local-coil array 50 may then receive a magnetic resonance signal from the body of the patient 100, because, as a result of the small distance, the signal-to-noise ratio (SNR) of the local-coil array 50 is better than when using the body coil 14 for reception. The MR signal received by the local-coil array 50 is conditioned in the local-coil array 50 and passed to the receiving device 60 according to one or more of the present embodiments of the radiofrequency unit 22 of the magnetic resonance tomograph 1 for analysis and image acquisition. In this process, the local-coil array 50 uses a local oscillator (not shown) and a mixer to convert received magnetic resonance signals into a different frequency range in each case (e.g., so that both the magnetic resonance signals from two antenna coils of a local-coil array 50 may be transmitted in one coaxial cable or another waveguide as a signal connection to the radiofrequency unit 22).

Figure 2:
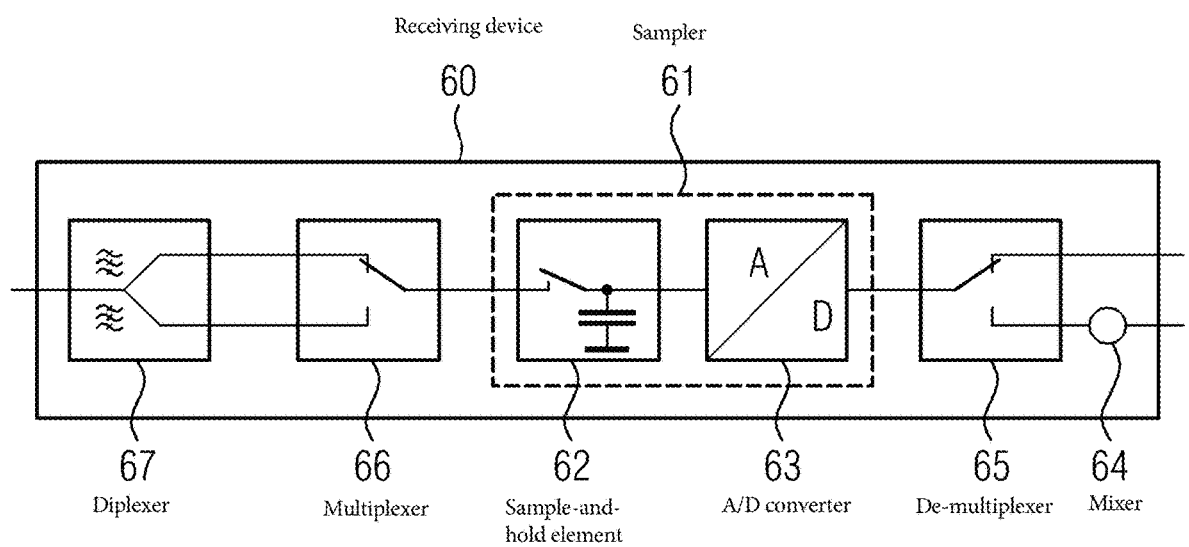
FIG. 2 shows an embodiment of a receiving device.

FIG. 2 shows schematically an exemplary embodiment of a receiving device 60. In the exemplary embodiment shown in FIG. 2, it is initially assumed that a signal line supplies two magnetic resonance signals in a frequency multiplex.

The two magnetic resonance signals are first separated in a diplexer 67, with the result that the signals are output separately each at a signal output of the diplexer. Output separately may be that the other signal in each case is attenuated at the output by 20 dB, 40 dB, 60 dB or more with respect to the wanted signal. This may be achieved, for example, by the signal input of the diplexer 67 being connected via a low-pass filter to the one signal output and via a high-pass filter to the other signal output of the diplexer 67. The cutoff frequency of the high-pass filter and of the low-pass filter lies between the center frequencies MF1 and MF2 of the two signals. Separating the signals halves the maximum signal level at the input to the subsequent stages, and given the same A/D converter 63, it is possible to improve the dynamic range by 6 dB at the same signal sampling rate.

The two signal outputs of the diplexer 67 are connected to subsequent signal inputs of a multiplexer 66. The multiplexer 66 connects one signal output of the diplexer 67 at a time alternately or in a rolling manner to the first signal-input of the sampler 61. The present embodiments are not limited in this context just to two signals that may be multiplexed. For example, a plurality of diplexers 67 that are connected to the multiplexer 66 may be provided in parallel. The multiplexer 66 then has a number of signal inputs equal to twice the number of diplexers 67.

In one embodiment, however, a plurality of magnetic resonance signals are supplied on a line in a frequency multiplex at a plurality of different center frequencies. Instead of the low-pass filter and the high-pass filter, the diplexer 67 then includes a corresponding number of bandpass filters and signal outputs that are connected to the subsequent multiplexer 66. A combination of a plurality of diplexers 67 with a plurality of signals in a frequency multiplex may also be provide.

The signal that is time-multiplexed by the multiplexer 66 is then supplied to the first signal-input of the sampler 61. The sampler 61 includes a sample-and-hold element 62, which is used to keep constant, during an analog-to digital conversion, the signal at the input to the subsequent A/D converter 63, which is connected to the signal output of the sample-and-hold element 62, in order to prevent bit errors caused by signal changes during the conversion. The sample-and-hold element 62 may include for this purpose a switch and a storage capacitance. The capacitance is connected via the switch briefly between two A/D conversions to the signal input of the sample-and-hold element 62 in order to charge the capacitance to the applied voltage. The finite conductivity of the switch and the source impedance of the preceding multiplexer 66 provides that charge transfer takes place in accordance with an exponential curve with negative exponent, with the result that the output voltage from the sample-and-hold element 62 always depends on the voltage of the signal from the preceding conversion (e.g., on the previously selected input of the multiplexer 66). Hence, during the A/D conversion, crosstalk between the separate signal inputs connected to the multiplexer 66 occurs between the currently selected input and the previously selected input. It is explained below in relation to FIGS. 3 and 4 how this crosstalk may be minimized according to one or more of the present embodiments.

The signal that is kept constant by the sample-and-hold element 62 is subsequently digitized by the A/D converter 63. According to the Nyquist theorem, the sampling of the signal is repeated in this process at a rate equal to at least twice the bandwidth of the signal. In the present case, although the first analog signal and the second analog signal are split by the diplexer 60 onto two different physical channels, and separated by the subsequent multiplexer into two different time slots, the information content still corresponds to the original signals. If in an exemplary solution, the one analog signal is situated at baseband between 0 Hz and the highest signal frequency, then mixing in the local coil 50 takes the second analog signal to a frequency that lies thereabove so that the two signals do not overlap in the frequency domain (e.g., components in the other frequency range in each case are attenuated by more than 20 dB, 40 dB or 60 dB). The effective bandwidth of the first analog signal and of the second analog signal for the sampling is therefore at least double the bandwidth of the original magnetic resonance signal. The minimum required sampling rate AR may hence be twice the doubled bandwidth, or four times the original bandwidth of a magnetic resonance signal or a single analog signal. As a result of the time multiplexing, this is to be done for each multiplexed channel, and therefore, the sample-and-hold element 62 and the A/D converter 63 work at a sample rate equal to the number of channels multiplied by the sampling rate AR.

These are minimum values for the sample rate and the sampling rate AR. It may be provided, for example, to provide an additional margin for a shift in the center frequencies that may occur in the case of shimming or multislice, and to select the sampling rate to be correspondingly higher.

In the embodiment shown in FIG. 2, a demultiplexer 65 then splits the data stream from the A/D converter 63 into separate data streams. In one embodiment, the signal is separated in digital signal processing only logically, and the data streams continue to be carried on one physical signal connection.

In addition, the receiving device 60 includes in a signal path a mixer 64 that mixes the digitized signal with a frequency equal to half the sampling rate AR (e.g., with AR/2). In the explanation below relating to FIG. 3, it is assumed that the mixer 64 is used on the second digital signal, which is derived from the first analog signal. A center frequency MF2 of the second digital signal is greater than the center frequency MR1 of the first analog signal.

In the simplest form, the mixer 64 may be implemented by a switch that inverts the sign for every second sample of the second digital signal, which process in the digital signal processing corresponds to mixing at half the sampling rate AR, and may be implemented using minimum processor resources.

The frequency-mirroring about AR/4 may also be achieved, however, by FIR filters that have a decimator functionality. The decimator FIR filters in signal paths for the first digital signal and the second digital signal have identical coefficients that differ merely by an alternating factor $(-1)^n$ in front of the filter coefficients $F_n$. The frequency mirroring device and the subsequent filter are thereby combined in one functional unit or signal processing process, which economizes on resources.

Figure 3:
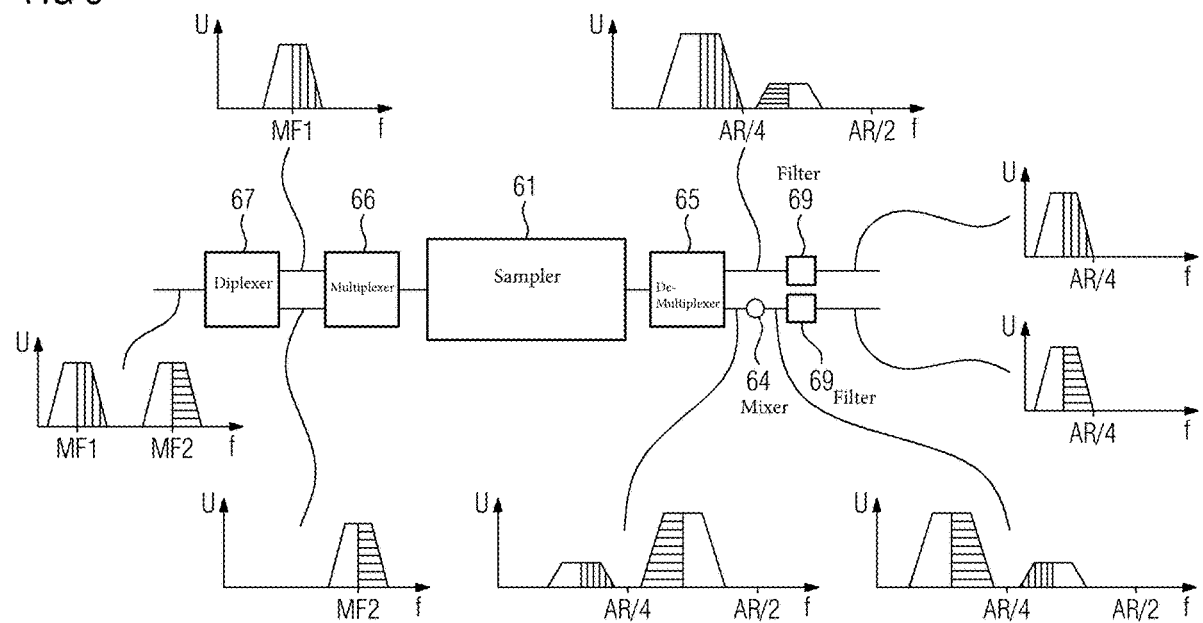
FIG. 3 is a schematic diagram of signals in the receiving device according to an embodiment in the frequency domain.

FIG. 3 shows a schematic diagram of an exemplary embodiment of the signals in the receiving device according to an embodiment in the frequency domain. In the diagram, the receiving device 60 is supplied with two signals at the center frequencies MF1 and MF2 in a frequency multiplex. In the middle are shown schematically each of the functional units of FIG. 2, and above and below these units are shown the associated signals after the functional units, with the peak signal voltage U plotted against frequency in arbitrary units.

Shown above the device are respectively the first analog signal or digital signal, and underneath are the frequency-multiplexed signal (in the first graph on the left) and then, respectively, the second analog or digital signal. The shading is used to indicate in each case the spectral position relative to the center frequency. The spectral position may be mirrored by mixing. The vertical hatching identifies the first signal, which has the lower center frequency MF1 at the input, and the horizontal hatching identifies the second signal, which has the higher center frequency MR2 at the input.

A sampling rate of 10 MHz is assumed in the example of FIG. 3. The center frequencies are selected by way of example using m=1 and n=1 in the equations (1) mentioned later: MF1=Fx=10 MHz (1-7/8)=1.25 MHz and MF2=Fo=10 MHz (1-3/8)=6.25 MHz.

The first analog signal having the center frequency MF1, and the second analog signal having the center frequency MF2 are present at the input to the receiving device 60. The diplexer 67 separates both signals, so that, apart from a residual part (not shown) resulting from the finite slope of the filter, only one of the two signals is on either of the separated lines. This process does not change the position in the frequency domain.

Two digital signals exist after the time multiplexing in the multiplexer 66 and the A/D conversion in the sampler 61. The sampling rate AR in the example is selected to equal 10 MHz and hence to be significantly larger than the bandwidth of either one of the signals (e.g., 0.5 to 1 MHz) or the sum of the bandwidths of the signals.

In principle, another conceivable situation is that the sampling rate lies between the center frequencies MF1 and MF2 or is less than the center frequencies if m and n in equation (1) or (2) are selected to be of correspondingly large value. This is possible provided the sum of the bandwidths of the signals remains less than half the sampling rate in accordance with the Nyquist theorem. For the situation in which, for example, the sampling rate of 10 MHz lies between MF1=8.2 MHz and MF2=13.2 MHz and hence both signals lie in different Nyquist bands, bandpass sub-sampling is performed for the first analog signal and the second analog signal. Owing to the spectral position of the first analog signal in the second Nyquist band for the second analog signal, the frequencies are mirrored, for example, so that the spectral position after the A/D conversion also changes side for the first digital signal. Thus, additional frequency-mirroring, beyond that of FIG. 3, may be necessary in subsequent processing in order to bring the first digital signal and the second digital signal back into the same spectral position.

In FIG. 3, however, the frequencies AR=10 MHz, MF1=1.25 MHz, and MF2=6.25 MHz are assumed for the sake of simpler illustration below.

In addition, in FIG. 3, the first digital signal and the second digital signal are also physically separated by the demultiplexer 65. In principle, the processing may also be performed in the time multiplex in digital signal processing if there is sufficient processing power.

After the mixer 64, which mixes the second digital signal with a signal of frequency AR/2, the second digital signal is in a mirrored state about the frequency AR/4, thereby arriving in the same frequency position as the first digital signal.

Finally, filters 69 (e.g., low-pass filters having a cutoff frequency AR/4) suppress the unwanted crosstalk products, so that now, just the first digital signal and the second digital signal, without this interference, are available for further image analysis.

It is a fundamental requirement according to one or more of the present embodiments that the sampling rate AR and the center frequencies satisfy the following condition: m*AR<MF1<(m+1/4)*AR and (n+1/2)*AR<MF2<(n+3/4)*AR; or (m+1/4)*AR<MF1<(m+1/2)*AR and (n+3/4)*AR<MF2<(n+1)*AR; where m, n are elements of the natural numbers including zero.

This is satisfied for the following frequency combinations, for example: Fx=AR(p−7/8) and Fo=AR(q−3/8) (equations 1) or Fxx=AR(p−5/8) and Foo=AR(q−1/8) (equations 2), where p and q are elements of the natural numbers excluding zero.

The following frequency combinations may also be used: Fx=AR(p−7/8) and Fxx=AR(q−5/8) or Fo=AR(p−3/8) and Foo=AR(q−1/8).

These two latter frequency combinations, however, result in the first digital signal and the second digital signal having opposite spectral orientations.

Figure 4:
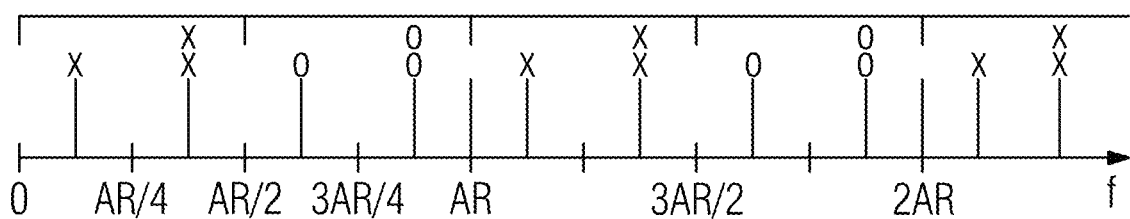
FIG. 4 is a schematic diagram of a frequency scheme for a receiving device according to an embodiment.

The frequency combinations are plotted on the frequency axis in FIG. 4. The x, xx, o and oo above the frequency lines denote here the frequencies Fx, Fxx, Fo and Foo according to the equations above.

Such frequency combinations may be used, for example, when more than two magnetic resonance signals are supplied in one cable by a frequency multiplex.

If, on the other hand, a plurality of cables each containing just two signals in a frequency multiplex are connected to the receiving device according to one or more of the present embodiments, then, for example, the frequency pair shown in FIG. 3, or another pair according to the equations, each applied alternately to successive terminals of the multiplexer 66, suffices to prevent crosstalk according to the present embodiments.

Although the invention has been illustrated and described in detail using the exemplary embodiment, the invention is not limited by the disclosed examples, and a person skilled in the art may derive other variations therefrom without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A receiving device for receiving a first signal having a first center frequency, and a second signal having a second center frequency, wherein the first center frequency differs from the second center frequency, wherein the receiving device is configured to receive the first signal and the second signal from a single cable by frequency multiplexing, the receiving device comprising:
a sampler, wherein the receiving device is configured to supply the first signal and the second signal to a first signal-input of the sampler in a time multiplex, wherein the sampler is configured to digitize the time-multiplexed first and second signals into a first digital signal and a second digital signal at a sampling rate for output at a second signal-output;
a filter configured to filter crosstalk products of the sampler for the first digital signal, the second digital signal, or the first digital signal and the second digital signal, a cutoff frequency of the filter being at a quarter of the sampling rate; and
a frequency mirroring device configured to mirror the second digital signal about a quarter of the sampling rate,
wherein a half sampling-rate or an integral multiple of the half sampling-rate lies between the first center frequency and the second center frequency.

2. The receiving device of claim 1, further comprising a mixer as the frequency mirroring device, the mixer being configured to mix the second digital signal with a frequency equal to half the sampling rate.

3. The receiving device of claim 1, further comprising a decimator as the frequency mirroring device.

4. The receiving device of claim 1, wherein for the first center frequency and the second center frequency:
m*AR<MF1<(m+1/4)*AR and (n+1/2)*AR<MF2<(n+3/4)*AR or
(m+1/4)*AR<MF1<(m+1/2)*AR and (n+3/4)*AR<MF2<(n+1)*AR,
wherein m and n are natural numbers including zero, MF1 is the first center frequency, MF2 is the second center frequency, and AR is the sampling rate.

5. The receiving device of claim 1, wherein for the first center frequency and the second center frequency:
m*AR<MF1<(m+1/4)*AR and (n+1/4)*AR<MF1<(n+1/2)*AR or
(m+1/2)*AR<MF2<(m+3/4)*AR and (n+3/4)*AR<MF2<(n+1)*AR,
wherein m and n are natural numbers including zero, MF1 is the first center frequency, MF2 is the second center frequency, and AR is the sampling rate.

6. The receiving device of claim 4, wherein the receiving device is configured to digitize, by the sampler, a plurality of pairs of first signals and second signals in a time multiplex for output as a plurality of second digital signals and third digital signals at the second signal-output, and
wherein the first center frequencies of all pairs of the plurality of pairs of first signals and second signals are different.

7. The receiving device of claim 4, wherein the receiving device is configured to digitize, by the sampler, a plurality of pairs of first signals and second signals in a time multiplex for output as a plurality of second digital signals and third digital signals at the second signal-output, and
wherein the first center frequency is substantially identical and the second center frequency is substantially identical in each pair of the plurality of pairs of first signals and second signals.

8. The receiving device of claim 1, wherein the mixer comprises a changeover switch, the changeover switch being configured to invert a sign for every second sample in the second digital signal.

9. The receiving device of claim 1, further comprising a time multiplexer,
wherein a first signal-output of the time multiplexer has a signal connection to a first signal-input of the sampler, and
wherein the time multiplexer is configured to multiplex the first signal and the second signal in time for output at the first signal-output to the sampler.

10. The receiving device of claim 9, further comprising a diplexer having a plurality of third signal-outputs,
wherein the diplexer is configured to:
separate an incoming frequency-multiplexed signal into individual channels; and
output the individual channels separately at the plurality of third signal-outputs, and
wherein each signal-output of the plurality of third signal-outputs has a signal connection to a signal input of the time multiplexer.

11. A magnetic resonance tomograph comprising:
a receiving device for a first signal having a first center frequency, and a second signal having a second center frequency, wherein the first center frequency differs from the second center frequency, the receiving device comprising:
a sampler, wherein the receiving device is configured to supply the first signal and the second signal to a first signal-input of the sampler in a time multiplex, wherein the sampler is configured to digitize the time-multiplexed first and second signals into a first digital signal and a second digital signal at a sampling rate for output at a second signal-output;
a frequency mirroring device configured to mirror the second digital signal about a quarter of the sampling rate, wherein a half sampling-rate or an integral multiple of the half sampling-rate lies between the first center frequency and the second center frequency; and
a filter configured to filter crosstalk products of the sampler for the first digital signal, the second digital signal, or the first digital signal and the second digital signal, a cutoff frequency of the filter being at a quarter of the sampling rate; and
a local-coil array having a plurality of antenna coils, the local-coil array being configured to transmit, over a signal connection, a plurality of magnetic resonance signals from the plurality of antenna coils in a frequency multiplex.

12. A method for operating a magnetic resonance tomograph, the magnetic resonance tomograph comprising a receiving device for receiving a first signal having a first center frequency, and a second signal having a second center frequency, wherein the first center frequency differs from the second center frequency, wherein the receiving device is configured to receive the first signal and the second signal from a single cable by frequency multiplexing, wherein the receiving device comprises a frequency mirroring device, a filter, and a sampler, wherein the first signal and the second signal are supplied to a first signal-input of the sampler in a time multiplex, the method comprising:

- digitizing the time-multiplexed first and second signals into a first digital signal and a second digital signal at a sampling rate, and
- filtering crosstalk products of the sampler for the first digital signal, the second digital signal, or the first digital signal and the second digital signal, a cutoff frequency of the filter being at a quarter of the sampling rate,
- wherein the second digital signal is mirrored in a frequency domain about a quarter of the sampling rate.

13. In a non-transitory computer-readable storage medium that stores instructions executable by a controller of a magnetic resonance tomograph to operate a magnetic resonance tomograph, the magnetic resonance tomograph comprising a receiving device for receiving a first signal having a first center frequency, and a second signal having a second center frequency, wherein the first center frequency differs from the second center frequency, wherein the receiving device is configured to receive the first signal and the second signal from a single cable by frequency multiplexing, wherein the receiving device comprises a frequency mirroring device, a filter, and a sampler, wherein the first signal and the second signal are supplied to a first signal-input of the sampler in a time multiplex, the instructions comprising:

- digitizing the time-multiplexed first and second signals into a first digital signal and a second digital signal at a sampling rate, and
- filtering crosstalk products of the sampler for the first digital signal, the second digital signal, or the first digital signal and the second digital signal, a cutoff frequency of the filter being at a quarter of the sampling rate,
- wherein the second digital signal is mirrored in a frequency domain about a quarter of the sampling rate.

\* \* \* \* \*